United States Patent
Setiadi et al.

(10) Patent No.: US 8,854,772 B1
(45) Date of Patent: Oct. 7, 2014

(54) ADHESION ENHANCEMENT OF THIN FILM PZT STRUCTURE

(71) Applicant: Seagate Technology LLC, Cupertino, CA (US)

(72) Inventors: Dadi Setiadi, Edina, MN (US); Wei Tian, Eden Prairie, MN (US); Young Pil Kim, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/886,780

(22) Filed: May 3, 2013

(51) Int. Cl.
*G11B 21/24* (2006.01)
*H01L 41/053* (2006.01)
*G11B 5/48* (2006.01)
*B82Y 30/00* (2011.01)

(52) U.S. Cl.
CPC ............ *H01L 41/053* (2013.01); *G11B 5/4873* (2013.01); *B82Y 30/00* (2013.01); *Y10S 977/837* (2013.01)
USPC ........................................ 360/294.4; 977/837

(58) Field of Classification Search
USPC ....................................................... 360/294.4
See application file for complete search history.

(56) References Cited

U.S. PATENT DOCUMENTS

| | | | |
|---|---|---|---|
| 6,104,525 | A | 8/2000 | Min |
| 8,022,603 | B2 | 9/2011 | Kiefer et al. |
| 8,289,652 | B2 | 10/2012 | Zambri et al. |
| 2007/0277603 | A1* | 12/2007 | Usui et al. .................. 73/290 V |
| 2009/0236933 | A1* | 9/2009 | Takahashi et al. ............ 310/311 |
| 2011/0228013 | A1* | 9/2011 | Ohashi et al. .................. 347/68 |
| 2012/0326298 | A1 | 12/2012 | Lu et al. |
| 2013/0005081 | A1 | 1/2013 | Chen et al. |

* cited by examiner

*Primary Examiner* — Allen T Cao
(74) *Attorney, Agent, or Firm* — HozerIPLaw, PC

(57) ABSTRACT

A microactuator, for example for a disc drive, comprising a substrate, a sandwich structure on the substrate, and a passivation layer over the substrate and the sandwich structure. The sandwich structure has a bottom electrode formed from noble metal, a piezoelectric layer, and a top electrode formed from noble metal. The microactuator further has one or both of a bottom adhesion layer present between the bottom electrode and the passivation layer, and a top adhesion layer present between the top electrode and the passivation layer. That is, the microactuator may have only the bottom adhesion layer, only the top adhesion layer, or both the bottom adhesion layer and the top adhesion layer.

20 Claims, 6 Drawing Sheets

ADHESION ENHANCEMENT OF THIN FILM PZT STRUCTURE

BACKGROUND

Hard disc drive systems (HDDs) typically include one or more data storage discs. A transducing head carried by a slider is used to read from and write to a data track on a disc. A head gimbal assembly (HGA) allows precise positioning of the data transducer head adjacent the tracks by allowing the transducer to gimbal along multiple axes to follow the topography of the media surface. The microactuator reduces resonance modes of the HGA and provides second order positional control capabilities. Microactuators can be formed from piezoelectric (PZT) or other materials to induce controlled rotation of the HGA transducer. While operable, limitations associated with current microactuator designs can include the need for increased HGA stack heights, the introduction of asymmetric drive and resonance characteristics, increased HGA preload force concentrations, and the need for an additional interposer structure in the HGA to separately route the electrical control signals to the microactuator and the slider.

SUMMARY

The present disclosure provides improvements for head gimbal assemblies, by providing protection for the microactuator by way of a passivation layer. This disclosure provides several structures having enhanced adhesion of the passivation layer to the microactuator and methods of making those structures.

One particular embodiment of this disclosure is a microactuator comprising a substrate, a sandwich structure on the substrate, and a passivation layer over the substrate and the sandwich structure. The sandwich structure has a bottom electrode formed from a noble metal, a piezoelectric layer, and a top electrode formed from a noble metal. The microactuator further has one or both of a bottom adhesion layer present between the bottom electrode and the passivation layer, and a top adhesion layer present between the top electrode and the passivation layer. That is, the microactuator may have only the bottom adhesion layer, only the top adhesion layer, or both the bottom adhesion layer and the top adhesion layer.

Another particular embodiment of this disclosure is a microactuator comprising a silicon substrate, a bottom electrode on the substrate, a piezoelectric layer on and in contact with a first section of the bottom electrode, a top electrode on and in contact with the piezoelectric layer, a bottom adhesion layer on a second section of the bottom electrode, a top adhesion layer on the top electrode, and a passivation layer over the bottom adhesion layer and the top adhesion layer.

Yet another particular embodiment of this disclosure is a disc drive comprising a microactuator, a suspension assembly, and a head gimbal assembly. The microactuator can have a silicon substrate, a bottom electrode comprising one of platinum, iridium, ruthenium, or rhodium on the substrate, a piezoelectric layer on and in contact with a first section of the bottom electrode, a top electrode comprising one of platinum, iridium, ruthenium, or rhodium, on and in contact with the piezoelectric layer, a bottom adhesion layer on a second section of the bottom electrode, a top adhesion layer on the top electrode, and a dielectric passivation layer over the bottom adhesion layer and the top adhesion layer.

These and various other features and advantages will be apparent from a reading of the following detailed description.

BRIEF DESCRIPTION OF THE DRAWING

The disclosure may be more completely understood in consideration of the following detailed description of various embodiments of the disclosure in connection with the accompanying drawing, in which.

DETAILED DESCRIPTION

The present embodiments relate most generally to microactuator-based head gimbal assemblies (HGAs). Disclosed are improvements for protecting head gimbal assemblies, by providing a passivation layer over the piezoelectric (PZT) material. This disclosure provides several structures having enhanced adhesion of the passivation layer to the microactuator and methods of making those structures.

In the following description, reference is made to the accompanying drawing that forms a part hereof and in which are shown by way of illustration at least one specific embodiment. The following description provides additional specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above those other elements.

Figure 1:
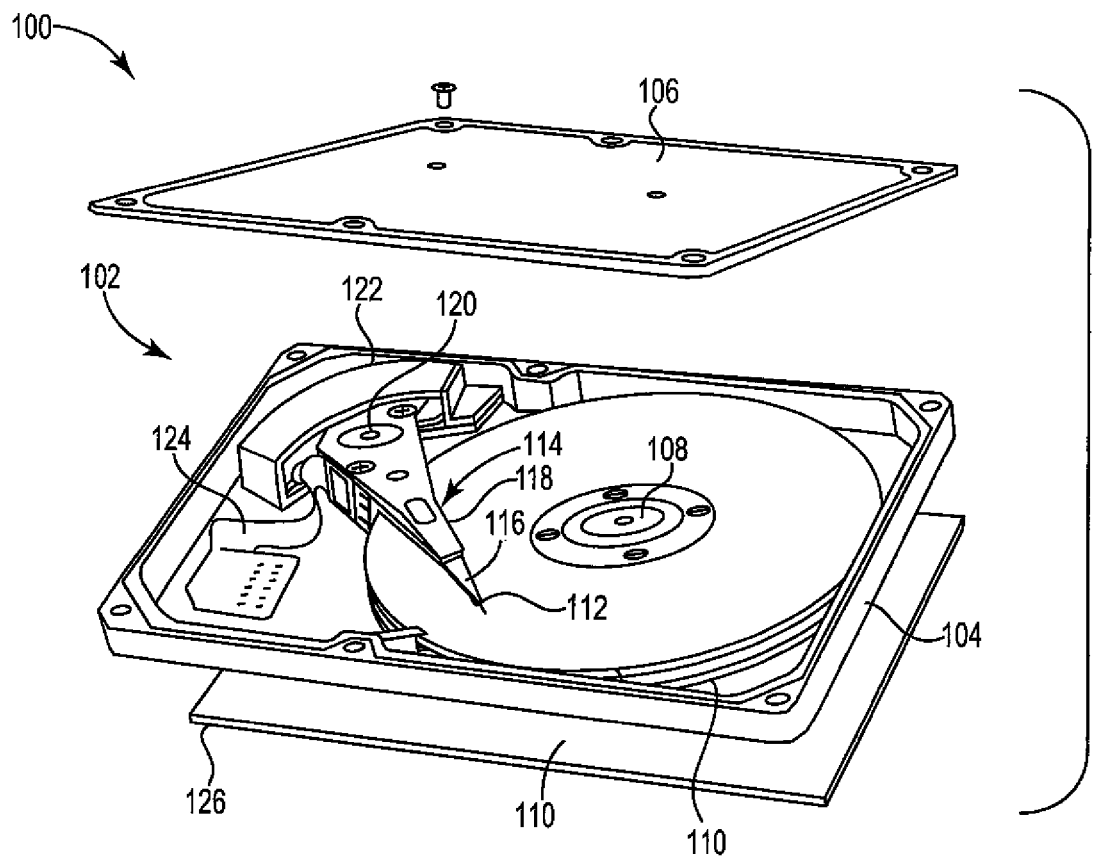
FIG. 1 is an exploded, perspective view of a data storage device.

Referring to FIG. 1, a top perspective view of a disc drive or data storage device 100 is shown. Storage device 100 is provided to show an exemplary environment in which various embodiments of the present invention can be practiced. It will be understood, however, that the claimed invention is not so limited.

Device 100 includes a sealed housing 102 formed from a base deck 104 and top cover 106. A spindle motor 108 is configured to rotate at least one storage medium such as a disc, in many embodiments multiple storage media or discs 110. Discs 110 are accessed by a corresponding array of data transducers that are each supported by a head gimbal assembly (HGA) 112. While FIG. 1 shows the use of two magnetic recording discs and four corresponding heads, other numbers of heads and discs (such as a single disc, etc.) and other types of media (such as optical media, etc.) can alternatively be utilized as desired.

Each HGA 112 is preferably supported by a head-stack assembly 114 (also referred to as an actuator) that includes a flexible suspension assembly 116, which in turn is supported by a rigid actuator arm 118. Actuator 114 pivots about a cartridge bearing assembly 120 through application of current to a voice coil motor (VCM) 122. In this way, controlled operation of VCM 122 causes the transducers of HGA 112 to align with tracks (not shown) defined on the disc surfaces to store data thereto or retrieve data therefrom.

A printed circuit cable 124 provides electrical communication between actuator 114 and device control electronics on an externally disposed device printed circuit board (PCB) 126. Printed circuit cable 124 can include multiple circuits that allow communication of several different components of device 100 with PCB 126.

Figure 2:
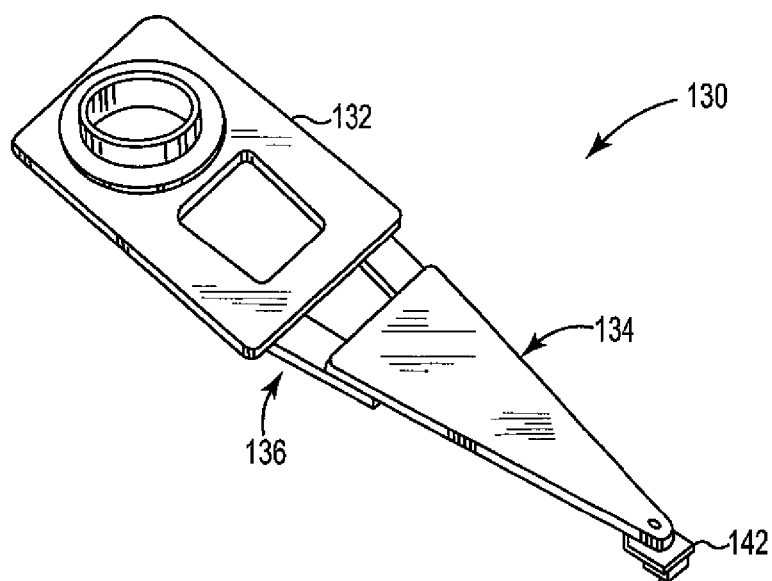
FIG. 2 is a perspective view of a suspension portion of the data storage device of FIG. 1.

FIG. 2 shows an exemplary actuator 130 that can be used in the data storage device of FIG. 1, where actuator is identified as element 114. Actuator 130 has a base 132 supporting a load beam 134 via a preload bend section 136; together, base 132, load beam 134 and section 136 form a rigid arm, such as actuator arm 118 of FIG. 1. An HGA 140 (identified as HGA 112 in FIG. 1) is supported at the distal end of the load beam 134 and includes a data transducer or head gimbaled for multi-axial rotation along pitch (x-axis) and roll (y-axis) directions via a gimbal plate 142 and dimple (not separately shown).

HGA 140 includes a slider having a bearing surface facing the associated disc surface. The bearing surface interacts with fluidic currents established by high speed rotation of the disc surface to hydrodynamically support the slider adjacent the surface. Such bearing surfaces are often referred to as "air bearing" surfaces even when a different fluid other than atmospheric air (e.g., an inert gas such as a helium) is retained within housing 102 of device 100. Read and write data transducing elements are mounted to the slider such as along a trailing edge thereof to transduce data from/to the media surface. Controlled articulation of the slider is implemented by incorporating a microactuator into HGA 140.

Figure 3:
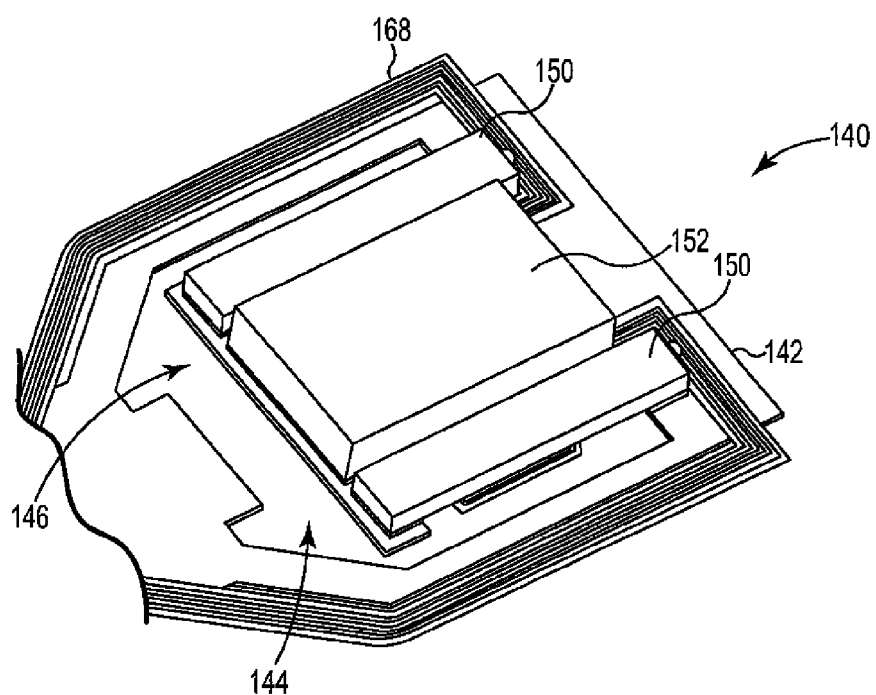
FIG. 3 is a perspective view of a head gimbal assembly of the suspension portion of FIG. 2.

An exemplary HGA 140 is shown in FIG. 3. HGA 140 has a gimbal plate 142 configured with an aperture 144 that extends through the thickness of the plate 142. A gimbal island 146 is disposed within aperture 144 of gimbal plate 142, and is a separate member not mechanically coupled to plate 142. That is, the gimbal island 146 is mechanically decoupled from the gimbal plate 142 to allow the island 146 to move independently of the plate 142 as will be discussed below.

HGA 140 includes a flex circuit 148 capable of transferring electric signals to electrodes (not shown) on gimbal island 146. In some embodiments, the entire length of flex circuit 148 is elastic and can maintain multiple circuit pathways that may correspond to independent circuits and interconnected circuits that are connected to components of HGA 140 by one or more electrodes. In the illustrated embodiment, six independent circuits are located on flex circuit 148 and have six corresponding electrodes (not shown) that can be electrically interconnected to a single component, such as a data transducing head, or multiple components, such as microactuators.

HGA 140 has two microactuators 150 and a slider 152. In various embodiments, each microactuator 150 is constructed of a piezoelectric (PZT) material and is connected to a portion of flex circuit 148. While the size, composition, and configuration of microactuators 150 is not limited, attachment of microactuators 150 to both gimbal island 146 and plate 142 can allow island 146 to be deflected by corresponding movement of one or both microactuators 150. The movement of microactuators 150 thus moves, pivots and twists slider 152 as appropriate so that the magnetic and/or optical transducing components of slider 152 are aligned to read data from and/or write data to a storage medium such as disc 110 of FIG. 1.

Figure 4:
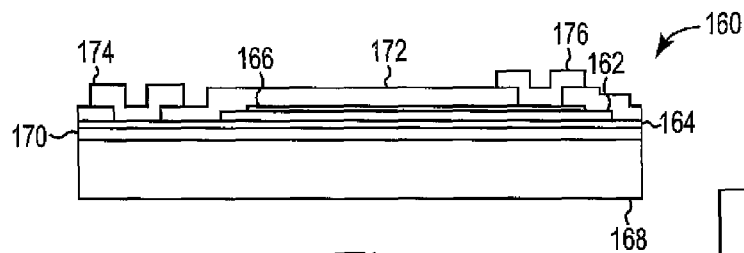
FIG. 4 is a schematic side view of a microactuator.

As track densities on disc 100 increase, precise control by HGA 140 is required, in order for slider 152 to be properly positioned. The precision of microactuators 150 is critical for positioning slider 152. FIG. 4 illustrates one embodiment of a thin film PZT microactuator 160.

Microactuator 160 has a thin film PZT layer 162 sandwiched by a first, bottom electrode 164 and a second, top electrode 166, all which is supported on a silicon substrate 168. As can be seen in FIG. 4, PZT layer 162 is present on only a section of bottom electrode 164, leaving a second and/or third section of bottom electrode 164 uncovered by PZT layer 162. A dielectric material 170 is present between bottom electrode 164 and substrate 168. As used throughout this disclosure, the "bottom electrode" is the electrode closer to the substrate than the "top layer"; this convention of "top" and "bottom," where "bottom" is closer to the substrate than the "top," is used consistently throughout this disclosure. A passivation layer 172 covers and preferably envelops PZT layer 162 and electrodes 164, 166. Passivation layer 172 provides physical and chemical protection to PZT layer 162 and electrodes 164, 166 from factors such as humidity, chemicals, particulate and other debris, and overall, from the surrounding environment. Electrically connected to top electrode 166 is top metal pad 176 and electrically connected to bottom electrode 164 (specifically, to the section of bottom electrode 164 not covered by PZT layer 162) is a bottom metal pad 174.

Examples of suitable materials for electrodes 164, 166 include noble metals such as platinum (Pt), iridium (Ir), ruthenium (Ru), rhodium (Rh), and alloys thereof. Other suitable materials for electrodes 164, 166 include oxides such as strontium titanium oxide (STO or $SrTiO_3$) and lanthanum nickel oxide (LNO). Top electrode 164 may be the same or different material than bottom electrode 166.

Metal pads 174, 176 are electrically conducting and provide electrical contact from electrodes 144, 146 to appropriate circuitry. Suitable materials for metal pads 174, 176 include gold (Au), silver (Ag), and copper (Cu).

Passivation layer 172 may be an electrically insulating material, although in some embodiments, passivation layer 172 is a dielectric material. Examples of materials suitable for passivation layer 172 include carbon, silicon dioxide or silica ($SiO_2$) (including different types of materials containing $SiO_2$ made by different techniques, e.g., high density plasma (HDP), chemical vapor deposition (CVD), flowable oxide (FOX), boron doped silicate glass (BSG), phosphorous doped silicate glass (PSG), borophosphosilicate glass (BPSG)), tetra-ethyl-ortho-silicate or tetra-ethoxy-silane (TEOS), aluminum oxide or alumina ($Al_2O_3$), titanium nitride (TiN), titanium sub-oxide ($TiO_x$), titanium carbide (TiC), silicon nitride ($Si_3N_4$), silicon oxynitride ($SiO_xN_y$), and silicon nitride oxide ($Si_2N_2O$).

In accordance with this disclosure, an adhesion layer is present among the layers of microactuator 160, to improve the adhesion of passivation layer 172 to the other layers of microactuator 160. Examples of suitable materials for the adhesion layer include titanium (Ti), tantalum (Ta), chromium (Cr), alloys thereof and mixtures thereof.

Figure 5:
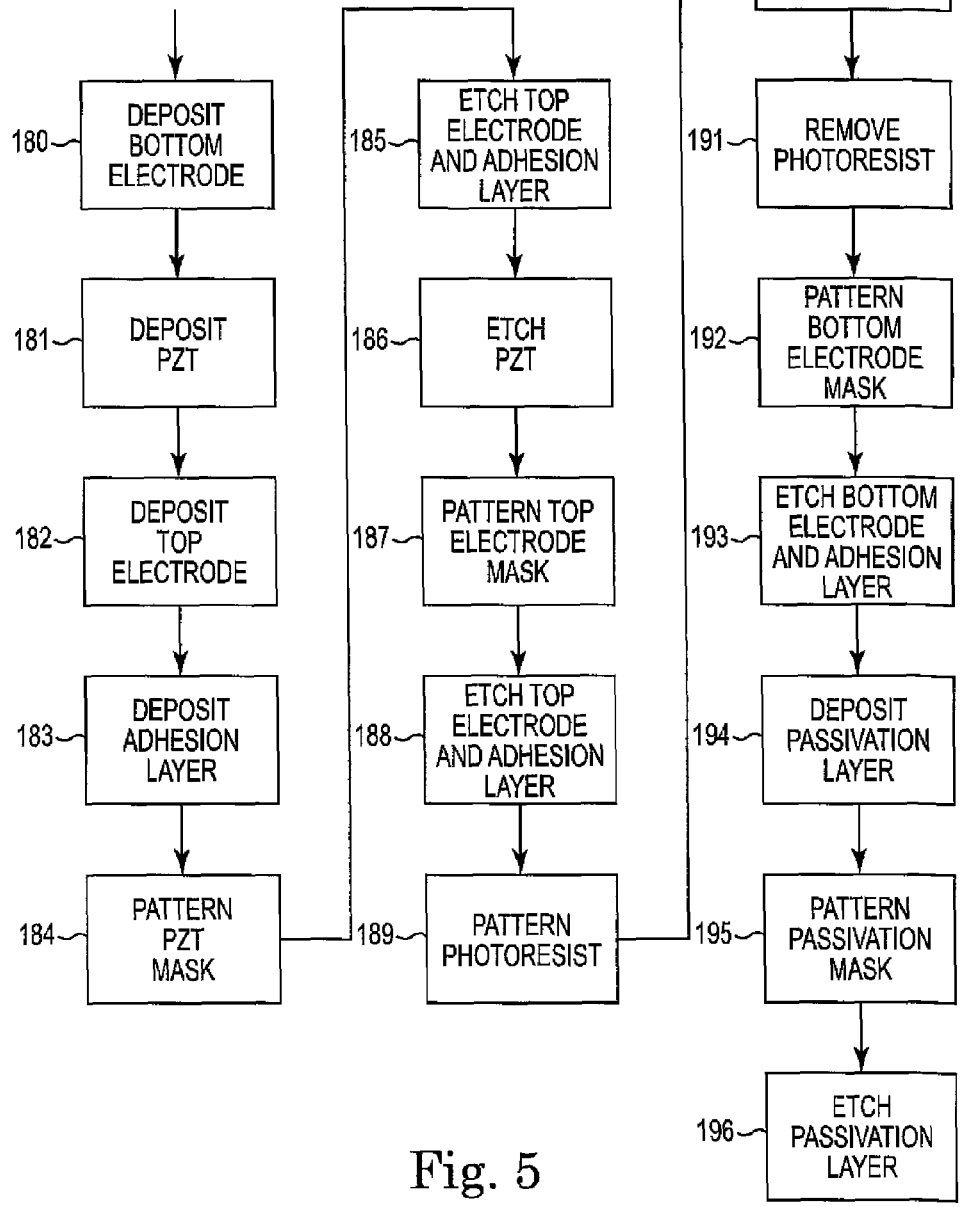
FIG. 5 is a block diagram of a method for forming a microactuator having a passivation layer and an adhesion layer.

One embodiment of a method for forming a microactuator with a passivation layer enhanced by an adhesion layer is outlined in FIG. 5; in this method, the adhesion between the top electrode and the dielectric passivation layer is increased. In step 180, a bottom electrode (e.g., electrode 166) is deposited, for example, on a silicon substrate (e.g., Si wafer) or on a dielectric material. In step 181, a PZT layer is deposited directly onto the bottom electrode from step 180. A top electrode (e.g., electrode 164) is deposited in step 183 directly onto the PZT layer from step 181. There is no intermediate or intervening layer between either electrode and the PZT layer. In step 183, an adhesion layer is positioned over the electrode from step 182. In step 184, a mask is applied over the adhesion layer and the top electrode. At this step in the process, the top electrode layer functions as a hard mask to etch the PZT layer. The unmasked areas of the adhesion layer and the top electrode are etched in step 185; the resulting exposed PZT material is etched in step 186. Subsequently, in step 187, a mask is deposited over the structure, particularly the top electrode, and patterned. The unmasked areas of the adhesion layer and the top electrode are etched in step 188, thus forming the top electrode. In step 189, a poly(methyl glutarimide) (PMGI) photoresist mask is patterned over the PZT layer and top electrode, forming a mask for the subsequent adhesion layer lift-off process. An adhesion layer is deposited over the structure, including the photoresist, in step 190, and the photoresist is removed in step 191, together with the adhesion layer present on the photoresist; any adhesion layer not having photoresist there below remains. In step 192, a patterned mask is deposited over the exposed bottom electrode, and the bottom electrode and adhesion layer are etched in step 193. A passivation layer is deposited in step 194 over the structure in step 194. In step 195, a patterned mask is deposited over the passivation layer, and the passivation layer is etched in step 196.

FIGS. 6A-6E illustrate an exemplary lift-off process of the adhesion layer. In general, a lift-off process is a simple, easy method for patterning deposited firms. A pattern is defined on a substrate using photoresist. A film, such as a metallic film, is blanket-deposited over the substrate, covering the photoresist and areas in which the photoresist has been removed. During the actual lifting-off process, the photoresist under the film is removed with solvent, taking the film with in, and leaving only the film that was deposited on the substrate.

Figure 6A:
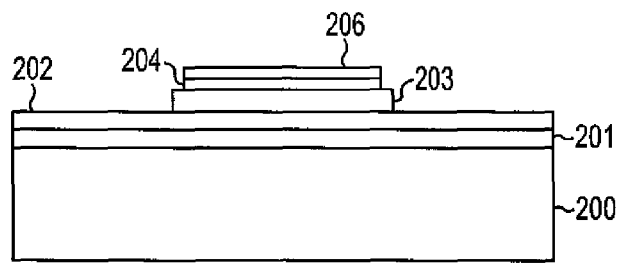
FIGS. 6A-6E illustrate, step-wise, the method of FIG. 5 for forming a microactuator having a passivation layer and an adhesion layer.
Figure 6B:
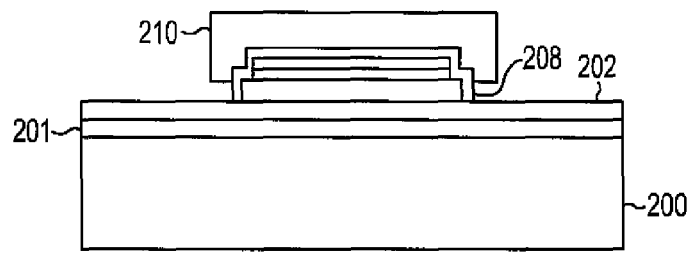
Figure 6C:
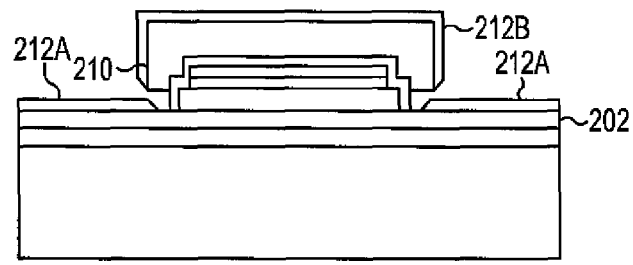
Figure 6D:
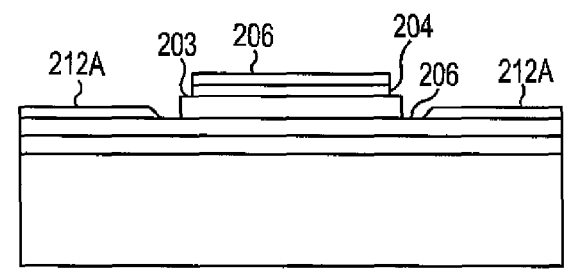
Figure 6E:
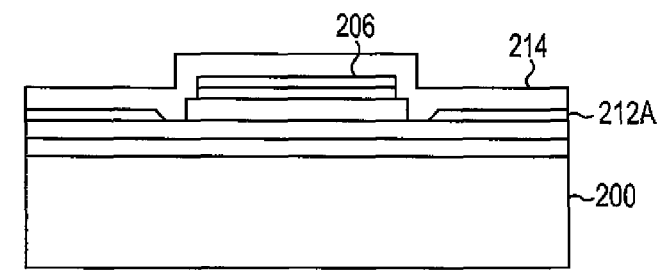

FIG. 6A shows a silicon substrate 200 having a dielectric layer 201 thereon. A first, bottom electrode 202, a PZT layer 203 and a second, top electrode 204 are arranged on substrate 200 and dielectric 201. Overlying top electrode 204 is an adhesion layer 206. The stack composed of PZT layer 203, electrode 204 and adhesion layer 206 is covered on its top and sides by a first layer of photoresist 208 in FIG. 6B. Photoresist layer 208 surrounds the stack, so that no portion of PZT layer 203, electrode 204 and adhesion layer 206 is exposed. Deposited over first photoresist layer 208 is a second photoresist layer 210, which may be deposited subsequently to or simultaneously with layer 208. The materials and/or thickness of photoresist layers 208, 210 are selected so that when photoresists 208, 210 are cured and patterned, second photoresist layer 210 etches faster than first photoresist layer 208, resulting in the structure of FIG. 6B. In the embodiment illustrated in FIG. 6B, the thick second photoresist 210 does not extend to electrode 202. A second adhesion layer 212 is deposited over the entire surface in FIG. 6C, resulting in adhesion layer portion 212A present on bottom electrode 202 and adhesion layer portion 212B present on second photoresist 210. In FIG. 6D, second photoresist 210 has been removed together with adhesion layer portion 212B and first photoresist 208, leaving adhesion layer portions 212A and adhesion layer 206 exposed. In the embodiment of FIG. 6D, an area of bottom electrode 202 is exposed and not covered by adhesion layer portion 212A, due to that area having been shadowed by second photoresist 210. In FIG. 6E, a passivation layer 214 is applied over the entire structure. The resulting structure has adhesion layer portion 212A present between bottom electrode 202 and passivation layer 214, and adhesion layer 206 present between top electrode 204 and passivation layer 214.

FIGS. 7A-7F illustrate another process for forming a microactuator with a passivation layer enhanced by an adhesion layer.

Figure 7A:
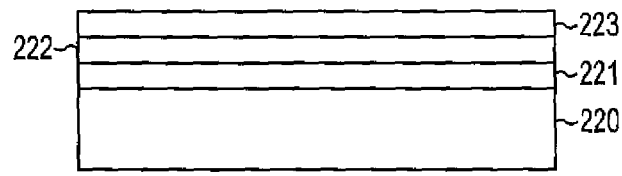
FIGS. 7A-7F illustrate, step-wise, another method for forming a microactuator having a passivation layer and an adhesion layer.
Figure 7B:
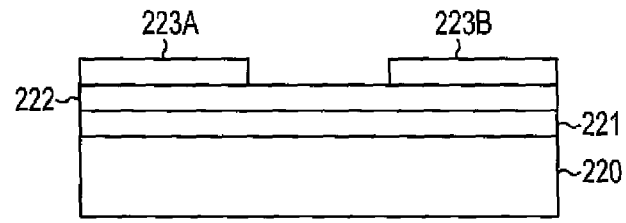
Figure 7C:
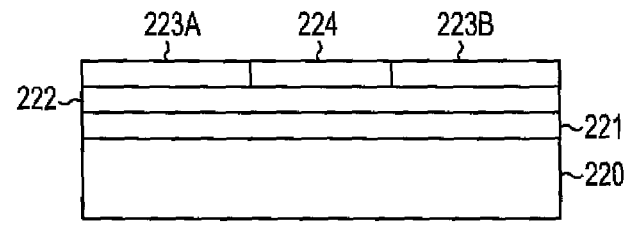
Figure 7D:
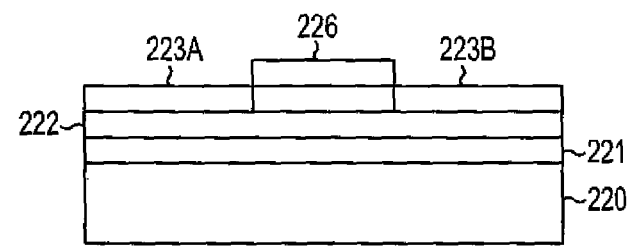
Figure 7E:
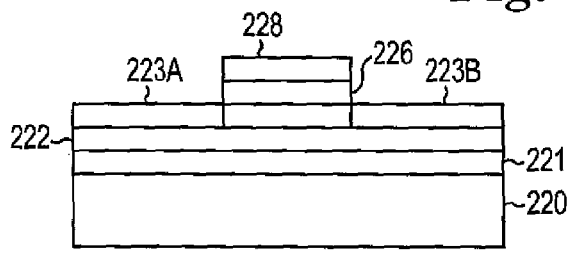
Figure 7F:
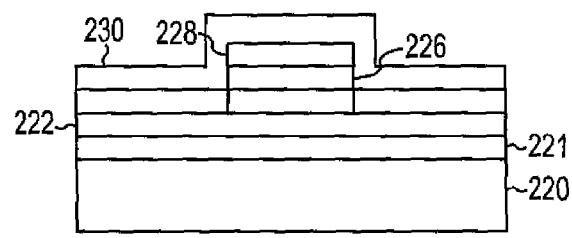

FIG. 7A shows a silicon substrate 220 having a dielectric layer 221, a first, bottom electrode 222, and an adhesion layer 223 thereon. In FIG. 7B, the adhesion layer is patterned to form two adhesion layer sections 223A and 223B with a gap or hole therebetween, and a portion of bottom electrode 222 exposed in the gap. In FIG. 7C, the gap between adhesion layer sections 223A, 223B is filled with PZT 224. A top electrode 226 is formed over PZT 224 in FIG. 7D, and a top adhesion layer 228 is formed in FIG. 7E. In FIG. 7F, the entire structure is covered with passivation layer 230. The resulting structure has adhesion layer sections 223A, 223B present between bottom electrode 222 and passivation layer 230, and adhesion layer 228 present between top electrode 226 and passivation layer 230.

As indicated above, silicon substrate 200, 220 may be a silicon-based substrate, such as a conventional Si wafer. In other embodiments, a non-silicon semiconductor material may be used for the substrate. Dielectric layer 201, 221 is generally present in the structure of this disclosure, however, it is optional.

Electrodes 202, 204, 222, 226 are composed of noble metals such as platinum (Pt), iridium (Ir), ruthenium (Ru), rhodium (Rh), and alloys thereof, or oxides such as strontium titanium oxide (STO or $SrTiO_3$) and lanthanum nickel oxide (LNO). Electrodes 202, 204, 222, 226 each typically have a thickness of 50 to 100 nm, although thinner and thicker electrodes 202, 204, 222, 226 could be used. Electrodes 202, 204, 222, 226 may be of the same or different material, and have the same or different thicknesses.

Also as indicated above, adhesion layer 206, 223A, 223B and adhesion layer portions 212A, 212B are composed of metal, such as titanium (Ti), tantalum (Ta) or chromium (Cr), although other metals or metal alloys could be used. The selection of the adhesion layer material is based on the adhesion coefficient of the adhesion material to the passivation layer, which is typically a dielectric material. Adhesion layer 206, 223A, 223B and portions 212A, 212B each typically have a thickness of 1 to 50 nm, in some embodiments 5 to 15 nm (e.g., 10 nm), although thinner and thicker adhesion layer 206, 223A, 223B and portions 212A, 212B could be used. Adhesion layer 206, 223A, 223B and portions 212A, 212B may be of the same or different material, and have the same or different thicknesses.

Also as indicated above, passivation layer 214, 230 may be an electrically insulating material or a dielectric material. Examples of materials suitable for passivation layer 214, 230 include carbon, silicon dioxide or silica ($SiO_2$), tetra-ethyl-ortho-silicate or tetra-ethoxy-silane (TEOS), aluminum oxide or alumina ($Al_2O_3$), titanium nitride (TiN), titanium sub-oxide ($TiO_x$), titanium carbide (TiC), silicon nitride ($Si_3N_4$), silicon oxynitride ($SiO_xN_y$), and silicon nitride oxide ($Si_2N_2O$). Passivation layer 214, 230 can be applied, for example, by plasma deposition, dielectric deposition, chemical vapor deposition (including plasma enhanced chemical vapor deposition, or PECVD). Passivation layer 214, 230 typically has a thickness of less than one micrometer, usually 0.2 to 0.7 micrometer (e.g., 0.5 micrometer).

Figure 8:
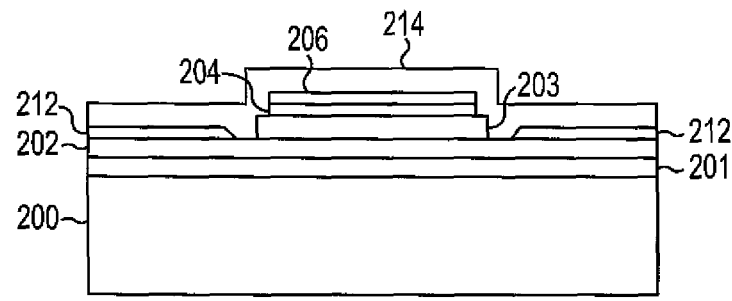
FIG. 8 is a schematic side view of a microactuator having a passivation layer and an adhesion layer.
Figure 9:
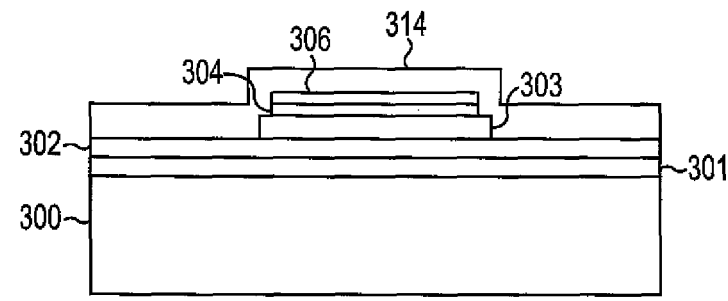
FIG. 9 is a schematic side view of another embodiment of a microactuator having a passivation layer and an adhesion layer.
Figure 10:
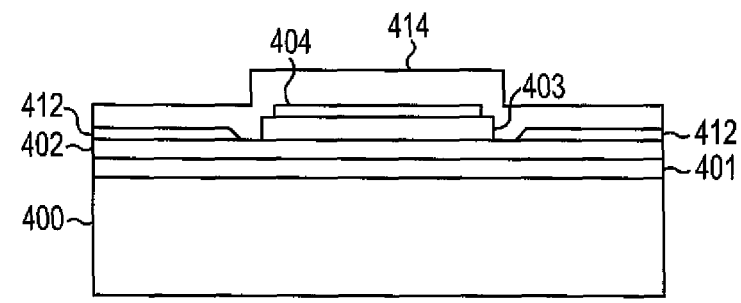
FIG. 10 is a schematic side view of another embodiment of a microactuator having a passivation layer and an adhesion layer.

FIGS. 8, 9 and 10 illustrate three microactuator constructions having an adhesion layer to improve the adhesion of the passivation layer. In FIG. 8, adhesion layer material is present between the passivation layer and the top electrode and the bottom electrode. In FIG. 9, adhesion layer material is present between the passivation layer and the top electrode, but is not present over the bottom electrode. In FIG. 10, adhesion layer material is present between the passivation layer and the bottom electrode, but is not present over the top electrode.

The structure of FIG. 8 is the same as the structure of FIG. 6E, having stacked substrate 200, dielectric 201, bottom electrode 202, PZT 203 and top electrode 204. A bottom adhesion layer 212 contacts bottom electrode 202 and a top adhesion layer 206 contacts top electrode 206. In this embodiment, a portion of bottom electrode 202 is not covered by adhesion layer 212; this is due to the process of making the structure, and other processes will provide a structure with bottom electrode fully covered by the adhesion layer. Overlying bottom adhesion layer 212 and top adhesion layer 206 is passivation layer 214.

In FIG. 9, stacked on substrate 300 are dielectric 301, bottom electrode 302, PZT 303 and top electrode 304. A top adhesion layer 306 contacts top electrode 306. In this embodiment, no portion of bottom electrode 302 is covered by an adhesion layer. Overlying bottom electrode 302 and top adhesion layer 306 is passivation layer 314.

In FIG. 10, stacked on substrate 400 are dielectric 401, bottom electrode 402, PZT 403 and top electrode 404. Over and contacting bottom electrode 402 is a bottom adhesion layer 412. In this embodiment, no portion of top electrode 404 is covered by an adhesion layer. Overlying bottom adhesion layer 412 and top electrode 404 is passivation layer 414.

Thus, embodiments of the ADHESION ENHANCEMENT OF THIN FILM PZT STRUCTURE are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A microactuator comprising:
    a substrate;
    a sandwich structure on the substrate, the sandwich structure consisting of a bottom electrode comprising a noble metal, a piezoelectric layer, and a top electrode comprising a noble metal; and
    a passivation layer over the substrate and the sandwich structure;
    the microactuator further comprising one or both of:
        a bottom adhesion layer present between the bottom electrode and the passivation layer; and
        a top adhesion layer present between the top electrode and the passivation layer.

2. The microactuator of claim 1 comprising both the bottom adhesion layer and the top adhesion layer.

3. The microactuator of claim 1 wherein the passivation layer comprises tetra-ethyl-ortho-silicate.

4. The microactuator of claim 1 wherein the passivation layer has a thickness of less than 1 micrometer.

5. The microactuator of claim 1 wherein the bottom electrode comprises platinum and the top electrode comprises ruthenium or platinum.

6. The microactuator of claim 1 wherein one or both of the adhesion layers comprises titanium, tantalum or chromium.

7. The microactuator of claim 6 wherein the adhesion layers have a thickness of 5 to 15 nm.

8. The microactuator of claim 1 further comprising a dielectric layer between the substrate and the sandwich structure.

9. A microactuator comprising:
    a silicon substrate;
    a bottom electrode on the substrate;
    a piezoelectric layer on and in contact with a first section of the bottom electrode;
    a top electrode on and in contact with the piezoelectric layer;
    a bottom adhesion layer on a second section of the bottom electrode;
    a top adhesion layer on the top electrode; and
    a passivation layer over the bottom adhesion layer and the top adhesion layer.

10. The microactuator of claim 9 further comprising a dielectric layer on the substrate, with the bottom electrode on the dielectric layer.

11. The microactuator of claim 9 wherein the bottom electrode and the top electrode each comprise a noble metal.

12. The micro actuator of claim 11 wherein the bottom electrode comprises platinum and the top electrode comprises ruthenium or platinum.

13. The microactuator of claim 9 wherein the bottom electrode and the top electrode each individually comprises platinum, iridium, ruthenium, rhodium, alloys thereof, strontium titanium oxide, or lanthanum nickel oxide.

14. The microactuator of claim 9 wherein the passivation layer comprises tetra-ethyl-ortho-silicate.

15. The microactuator of claim 14 wherein the passivation layer has a thickness of less than 1 micrometer.

16. The microactuator of claim 9 wherein one or both of the adhesion layers comprises titanium, tantalum or chromium.

17. The microactuator of claim 9 wherein the adhesion layers have a thickness of 5 to 15 nm.

18. A disc drive comprising a microactuator, a suspension assembly, and a head gimbal assembly; the microactuator comprising a silicon substrate, a bottom electrode comprising one of platinum, iridium, ruthenium, or rhodium on the substrate, a piezoelectric layer on and in contact with a first section of the bottom electrode, a top electrode comprising one of platinum, iridium, ruthenium, or rhodium, on and in contact with the piezoelectric layer, a bottom adhesion layer on a second section of the bottom electrode, a top adhesion layer on the top electrode, and a dielectric passivation layer over the bottom adhesion layer and the top adhesion layer.

19. The disc drive of claim 18 wherein the passivation layer comprises tetra-ethyl-ortho-silicate.

20. The disc drive of claim 18 wherein one or both of the adhesion layers comprises titanium, tantalum or chromium.

* * * * *